United States Patent [19]

Milkovic

[11] Patent Number: 4,495,463
[45] Date of Patent: Jan. 22, 1985

[54] ELECTRONIC WATT AND/OR WATTHOUR MEASURING CIRCUIT HAVING ACTIVE LOAD TERMINATED CURRENT SENSOR FOR SENSING CURRENT AND PROVIDING AUTOMATIC ZERO-OFFSET OF CURRENT SENSOR DC OFFSET ERROR POTENTIALS

[75] Inventor: Miran Milkovic, Scotia, N.Y.

[73] Assignee: General Electric Company, Somersworth, N.H.

[21] Appl. No.: 351,763

[22] Filed: Feb. 24, 1982

[51] Int. Cl.³ .................. G01R 21/06; G01R 1/20
[52] U.S. Cl. .................. 324/142; 324/127; 324/130
[58] Field of Search .......... 324/142, 107, 130, 127; 364/483, 842; 328/160; 330/9

[56] References Cited

U.S. PATENT DOCUMENTS

| | | | |
|---|---|---|---|
| 3,947,763 | 3/1976 | Milkovic | 324/142 |
| 3,955,138 | 5/1976 | Milkovic | 324/142 |
| 4,066,960 | 1/1978 | Milkovic | 324/142 |

Primary Examiner—Ernest F. Karlsen
Attorney, Agent, or Firm—Robert E. Brunson

[57] ABSTRACT

An electronic watt and kilowatt hour measuring circuit susceptible of being fabricated for the most part in solid state semiconductor monolithic integrated circuit form is provided. The electronic measuring circuit uses an active load terminated current transformer sensor for sensing alternating load current and a voltage transformer for sensing the alternating current voltage supplied from a source of alternating current electric energy being monitored. The output of the active load terminated current sensor transformer has an inherent DC-offset error voltage added to the alternating voltage which is proportional to the current being measured. This DC-offset error voltage is caused by the operational amplifier employed in the active load terminated current transformer sensor. By using time division multiplier circuits employing CMOS electronic switches as a means for multiplying the current and voltage signals together, the DC-offset error caused by the active load terminated current transformer sensor automatically will be zeroed out. The circuit can be employed as a straightforward multiplier to derive an output indication of instantaneous watts, or can be employed together with an analog-to-digital pulse rate converter for obtaining kilowatt hours of electrical energy consumed, and can be further modified to provide both instantaneous watts and kilowatt hours measurements, by appropriate design of the circuit together with system-wide correction of any DC-offset error voltages produced within the measuring circuit.

24 Claims, 5 Drawing Figures

ELECTRONIC WATT AND/OR WATTHOUR MEASURING CIRCUIT HAVING ACTIVE LOAD TERMINATED CURRENT SENSOR FOR SENSING CURRENT AND PROVIDING AUTOMATIC ZERO-OFFSET OF CURRENT SENSOR DC OFFSET ERROR POTENTIALS

TECHNICAL FIELD

This invention relates to a new and improved electronic watt and/or watthour meter measuring circuit for measuring alternating current electrical energy.

More particularly, the invention relates to such an electronic measuring circuit which for the most part is susceptible to manufacture in solid state semiconductor, monolithic integrated circuit form and which employs an improved current sensor of a reduced size, weight and cost.

BACKGROUND PRIOR ART

Electronic watt and watthour meters for measuring electrical energy supplied from a source of alternating current electric energy and which are susceptible to manufacture, at least in part, in solid state semiconductor, monolithic integrated circuit form, are well known and have been described in a number of prior art patents and publications. See, for example, the following U.S. patents issued in the name of Miran Milkovic, the inventor of the present application, and assigned to the General Electric Company:

U.S. Pat. No. 3,875,508, issued Apr. 1, 1975 "Metering Electrical Energy (KWH) In Single Phase Systems"

U.S. Pat. No. 3,947,763, issued Mar. 30, 1976 "C-MOS Electronic KWH Meter And Method For Metering Electrical Energy"

U.S. Pat. No. 3,955,138, issued May 4, 1976 "Electronic Energy Consumption Meter With Input Transformer Having Single Resistance Terminated Secondary Winding Coupled To C-MOS Switches Driven By Pulse Width Modulated Control Signals"

U.S. Pat. No. 4,056,775, issued Nov. 1, 1977 "Electronic KWH Meter Having Internal Power Supply And Error Correction System"

U.S. Pat. No. 4,217,546, issued Aug. 12, 1980 "Electronic Energy Consumption Meter And System With Automatic Error Correction" While the electronic measuring circuits described in each of the above-noted U.S. patents is satisfactory in many respects, there is always the need for improvement particularly with regard to the cost, size and complexity of components employed in the circuits.

One serious problem encountered with all measuring circuits of the above-described type including those listed above, is with respect to the sensors employed with the circuits and the necessary interface connections required to couple the sensors to the circuits. One of the elements employed with electronic measuring circuits of the above-noted type, is a conventional instrument current transformer having primary and secondary windings for developing an output signal voltage that is proportional to the current flowing in the primary winding, and supplying the same to the measuring circuit for processing. These conventional current transformers are relatively large and bulky, heavy and expensive and add substantially to the overall cost, size and weight of electronic measuring circuits employing such transformers for current sensing purposes.

SUMMARY OF INVENTION

The present invention overcomes the shortcomings of conventional current transformer sensors as discussed above, by employing in their stead an active load terminated current transformer with active load termination for use as the current sensor in an electronic measuring circuit of the type using CMOS electronic switches and which can be fabricated for the most part in solid state semiconductor monolithic integrated circuit form.

In practicing the invention an electronic measuring circuit for measuring alternating current electrical energy, is provided. This electronic measuring circuit has an active load terminated input current transformer with active load termination in the form of a transresistance operational amplifier connected across and terminating the secondary winding of a modified input instrument current transformer and wherein the transresistance operational amplifier supplies an output voltage proportional to the current flowing in the primary winding of the modified input current transformer and appears as a virtual short circuit across the secondary winding. Because the modified current transformer is virtually short circuited, the power transformed to its secondary winding is greatly reduced resulting in a considerable reduction in the volt-ampere rating of the transformer which thereby allows the size and cost of the modified current transformer to be considerably reduced since the only power required is that power needed to sustain the copper and iron losses incurred while operating the modified current transformer with active load termination. The measuring circuit further includes a voltage transformer for deriving an input signal representative of the voltage supplied from the source of electric energy being monitored. Electronic multiplier circuit means are provided for multiplying together the signal representative of the current supplied from the active load terminated input current transformer and the signal supplied from the voltage transformer and deriving an output signal representative of their product. The electronic multiplier circuit means comprises CMOS type electronic switches having first and second inputs and an output. A comparator circuit is supplied with an input reference signal having a sampling frequency $f_s$ which is much greater than the operating frequency of the alternating current electrical energy source being monitored, and with either of the signals representative of the current or voltage as a second input. A signal is derived at the output of the comparator which is a pulse-width modulated signal representative of either the current or voltage that is supplied to the first input of the multiplier circuit means. The other of the current or voltage signals is supplied to the second input terminal of the multiplier circuit means, and means are provided for deriving at the output from the multiplier circuit means an output amplitude modulated and pulse-width modulated product signal that is representative of the product of the current and the voltage supplied from the source of electric energy with any DC offset error caused by the active load terminated input current transformer being automatically zeroed out by the CMOS type electronic switches employed in the multiplier circuit means.

In preferred forms of the invention, the electronic measuring circuit further includes automatic offset error control circuit means intercoupled between the output from the measuring circuit and the input of the multiplier circuit for automatically averaging out any DC offset error voltages produced in the measuring circuit on a system-wide basis. This automatic offset error control circuit means preferably comprises analog-to-digital converter means coupled to the output from the multiplier circuit means for deriving an output pulse-waveform signal, each pulse of which represents a fixed unit amount of electric energy and further includes means for feeding back the pulse-waveform signal to an input of the multiplier circuit means for reversing polarity of one of the inputs to the multiplier circuit means with each unit output pulse produced by the analog-to-digital circuit means to thereby average out any DC offset error potentials in the measuring circuit on a system-wide basis. Different specific forms of the automatic offset error control circuit means thus comprised, are disclosed.

In another preferred embodiment of the invention integrating filter circuit means are coupled to the output from the multiplier circuit and are fabricated therewith in monolithic integrated circuit form, and watt indicating means are coupled to the output from the integrating filter circuit for deriving an output indication of the instantaneous watts being supplied by a source of electrical energy being monitored.

In still another preferred form of the invention, kilowatt hour indicating means are coupled to the output from the analog-to-digital converter means for deriving an output indication of the kilowatt hours of electrical energy being supplied by the source of electrical energy being monitored.

In yet another preferred form of the invention, both watt indicating means and kilowatt hour indicating means are provided for supplying both an indication of the instantaneous watts and the kilowatt hours of electrical energy being supplied from a source of alternating current electric energy being monitored.

BRIEF DESCRIPTION OF DRAWINGS

These and other objects, features, and many of the attendant advantages of this invention will become better understood upon a reading of the following detailed description, wherein like parts in each of the several figures are identified by the same reference character, and wherein.

BEST MODE OF PRACTICING INVENTION

Figure 1:
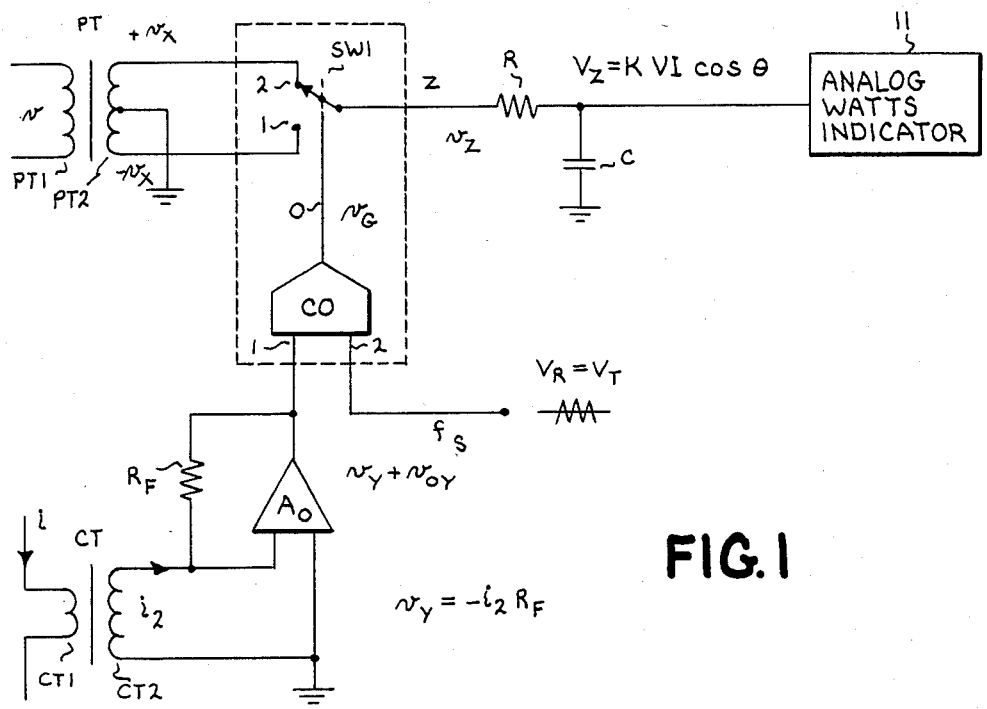
FIG. 1 is a schematic circuit diagram of a simplified form of the invention for deriving an output indication of the instantaneous watts of electrical energy being supplied from an alternating current source.

FIG. 1 is a schematic electrical diagram of an electronic measuring circuit for measuring alternating current electrical energy and constructed according to the present invention. The measuring circuit shown in FIG. 1 is comprised by an active load terminated input current transformer CT, $A_o$ which includes a primary winding CT1 to which a current i from a source of alternating current energy to be monitored, is supplied. The primary winding is inductively coupled to a modified secondary winding CT2 which has its output terminals connected across the input terminals of a feedback operational amplifier $A_o$ having one of the input terminals thereof directly grounded and the other input terminal connected to the output of the amplifier by means of feedback resistor $R_F$. The primary winding current i to be measured flowing in the primary winding CT1 induces in secondary winding CT2 a current $i_2$ which is proportional to the primary current i and hence proportional to the current to be measured. The active load terminated current transformer CT, $A_o$ is of the type described more fully in U.S. Pat. No. 3,815,013 issued Jun. 4, 1974 for a "Current Transformer With Active Load Termination"—Miran Milkovic, inventor, and assigned to the General Electric Company. For a more detailed description of the construction and operating characteristics of the active load terminated current transformer, reference is made to the above-noted U.S. Pat. No. 3,815,013, the disclosure of which is hereby incorporated into this application in its entirety. Briefly, however, it can be stated that the active load terminated current transformer CT, $A_o$ comprises a modified current transformer and transresistance operational amplifier combined in such a manner that the secondary winding CT2 of the current transformer is connected across the input of the operational amplifier $A_o$ with the result that the secondary winding CT2 appears to be virtually short circuited because of the very low input impedance of operational amplifier $A_o$. An output voltage $v_Y + v_{oY}$ is developed at the output of operational amplifier $A_o$ wherein $v_Y$ is equal to $-i_2 R_F$ and $v_{oY}$ is an undesired inherent DC-offset error voltage produced by the operational amplifier $A_o$ as will be explained hereafter. This output voltage is proportional to the current $i_2$ flowing in secondary winding CT2, and hence is proportional to and representative of the current i supplied from the source of alternating current electric energy being monitored. An important advantage, among others, of the active load terminated current transformer arrangement CT, $A_o$ is that a modified current transformer CT having a considerably lower volt-ampere capacity may be employed where if a conventional instrument current transformer were used in its stead, it would have to have a much larger volt-ampere capacity rating than is required with the current sensor CT, $A_o$ used in the measuring circuit shown in FIG. 1.

The signal $v_Y + v_{oY}$ representative of the current to be measured and appearing at the output of the active load terminated current transformer CT, $A_o$ is supplied as one input to a comparator circuit $C_O$. Comparator circuit $C_O$ is of conventional construction and is illustrated and described more fully in U.S. Pat. No. 3,875,508. In addition, the comparator $C_O$ has supplied to a second input terminal thereof a sampling signal $V_R=V_T$ having a triangular waveshape and a frequency $f_s$ which is much greater than the frequency of the alternating current being monitored. A suitable sampling signal generator for supplying the triangular waveshape sampling signal is described in U.S. Pat. No. 3,947,763. The comparator $C_O$ supplies at its output a signal $v_g$ which is a pulse width modulated signal representative of the current i flowing in the primary winding CT1 of the input current sensor CT, $A_o$. For a more detailed description of the construction and operation of the comparator $C_O$ and the manner in which it develops the output pulse-width modulated signal $v_g$ representative of the current to be measured, reference is made to the above-noted U.S. Pat. Nos. 3,875,508 and 3,947,763, the disclosures of which are hereby incorporated into this disclosure in their entirety.

The output $v_g$ from comparator $C_O$ is supplied as one input to a multiplier circuit means comprised by a CMOS switching circuit SWI which is schematically represented by a single-pole, double-throw switch having a movable contact to which the pulse-width modulated signal $v_g$ is supplied as a switching input signal. The CMOS switching circuit multiplier SWI in addition to the movable contact to which the input signal $v_g$ is supplied, further includes two fixed input terminals 1 and 2 which are connected across the output terminals of the secondary winding PT2 of an input voltage transformer PT whose primary winding PT1 is connected across the source of alternating current electric energy to be measured. The secondary winding PT2 of the input voltage transformer has its center tap grounded so that a potential $-v_X$ is applied to the fixed input terminal 1 of CMOS switching circuit SWI and a potential $+v_X$ is supplied to the fixed input terminal 2 of SWI. The CMOS switching multiplier circuit SWI has its movable contact switched back and forth between the fixed contacts 1 and 2 by the pulse-width modulated signal $v_g$ supplied from the output of comparator $C_O$ to result in an output amplitude modulated and pulse-width modulated product signal $v_Z$. The product signal $v_Z$ is integrated in an integrating filter circuit RC to develop at its output terminal an output signal $V_Z=K$ VI cos $\Theta$ which is applied to a suitable watts indicator 11 for providing an output indication of the instantaneous watts being supplied from the source of alternating current electric energy being monitored. For a more detailed description of the construction and operation of the multiplier switching circuit SWI and its theory of operation, reference is made to the above-noted U.S. Pat. Nos. 3,875,508; 3,947,763; 3,955,138; 4,056,775; and 4,217,546, the disclosures of which are hereby incorporated into this disclosure in their entirety.

The output $v_Z$ of the CMOS switching multiplier circuit is given by the expression:

$$v_Z = \frac{(v_X + V_{oX})(v_Y + V_{oY})}{V_R} \quad (1)$$

where $v_X$ and $v_Y$ are the instantaneous signal voltages and $V_{oX}$ and $V_{oY}$ represent the DC-offset error voltages at the multiplier inputs and $V_R$ is the reference sampling voltage.

By definition $v_X=V_{Xm} \sin \omega t$ and $v_Y=V_{Ym} \sin(\omega t+\Theta)$, where $\omega$ is the phase angle between the input voltage signal $v_X$ and input current signal $v_Y$ and where $V_{Xm}$ and $V_{Ym}$ are the peak values of $v_X$ and $v_Y$. With $$\frac{V_{Xm}}{\sqrt{2}} = V_X \text{ and } \frac{V_{Ym}}{\sqrt{2}} = V_Y$$

where $V_X$ and $V_Y$ are the rms values, $v_Z$ becomes:

$$v_Z = \frac{1}{V_R} [V_X V_Y \cos\theta + V_X V_Y \cos(2\omega t + \theta) + \quad (2)$$

$$V_{oX} V_Y \sin(\omega t + \theta) + V_{oY} V_X \sin(\omega t + \theta) + V_{oX} V_{oY}]$$

As noted in FIG. 1, the output from the CMOS switching multiplier SWI, $v_Z$ is integrated by the low pass filter R, C. Because of this, the time intervals of the second, third and fourth terms in equation (2) above become equal to zero so that:

$$V_Z = \frac{V_X V_Y}{V_R}(\cos\theta) + \frac{V_{oX} V_{oY}}{V_R} \quad (3)$$

From equation (3) it will be seen that $V_Z$ is a DC voltage proportional to the product of $V_X V_Y$ and cos $\Theta$, where $V_X$ and $V_Y$ are rms voltages. The offset term in equation (3) will become equal to zero if either $V_{oX}$ or $V_{oY}$ or both are equal to zero. As noted previously, the CMOS multiplier switching circuit SWI employs complementary MOS type analog switches which inherently in operation will cancel out DC voltages so that no DC-offset error voltage is capable of passing through the CMOS multiplier switches. Thus any DC-offset error voltage that is caused by the comparator CO and or the operational amplifier $A_o$ employed in the active load terminated current sensor CT, $A_o$, will be automatically zeroed out if $V_{oX}=0$. Thus, the output derived from the electronic measuring circuit shown in FIG. 1 becomes $V_Z=K$ VI cos $\Theta$, where K is a dimensional constant. Hence, $V_Z$ is equal to the product of the rms voltage and the rms current and the cos of the phase angle between V and I and therefore is proportional to the average power. For a disclosure of the DC signal zeroing characteristics of MOS and CMOS electronic switches, reference is made to the book "Mosfet In Circuit Design" by R. H. Crawford, Mc Graw-Hill, 1967.

Figure 2:
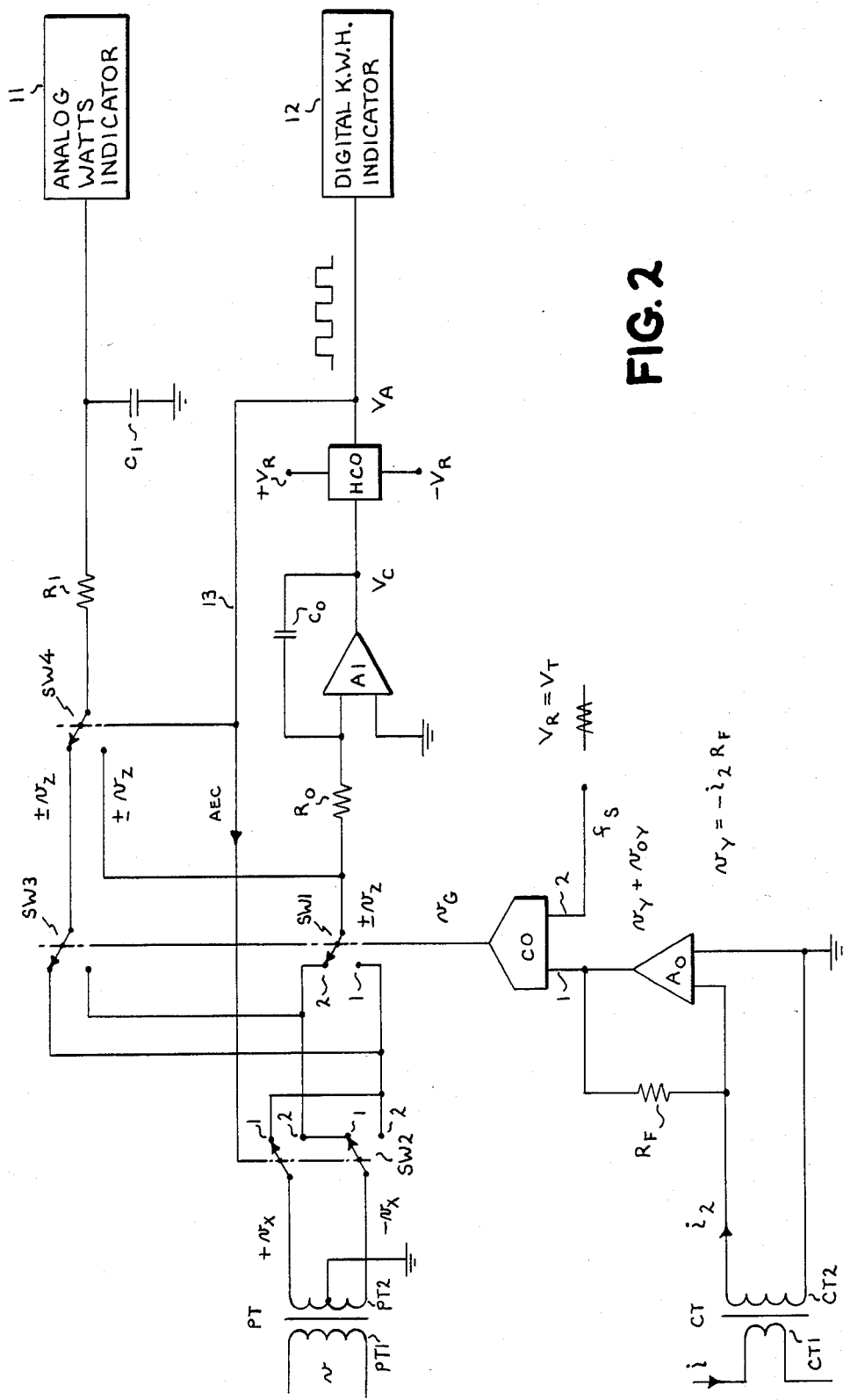
FIG. 2 is a schematic circuit diagram of a modified form of the invention for obtaining a measurement of the kilowatt hours and watts of electrical energy being supplied from a source of alternating current and wherein overall automatic offset error correction is provided for the measuring circuit on a system-wide basis.

In FIG. 2 is shown a combined watt and watthour electronic measuring circuit according to the invention which uses automatic error correction on a system-wide basis as described more fully in U.S. Pat. No. 3,955,138 and U.S. Pat. No. 4,217,546 both listed above, in U.S. Pat. No. 4,066,960 issued Jan. 3, 1978 for an "Electronic Kilowatt-Hour-Meter With Error Correction"—Miran Milkovic, inventor, assigned to the General Electric Company and in U.S. patent application Ser. No. 330,660, filed Dec. 18, 1981 for an "Electronic Watt and Watthour Meter Having Analog and Digital Outputs With Automatic Error Correction", the disclosures of which are hereby incorporated into this disclosure by reference. For a more detailed description of the construction and operation of an electronic measuring circuit providing automatic error correction on a system-wide basis, reference is made to the preceeding listed U.S. patents and the pending application. Briefly however, it can be stated that in a circuit such as that shown in FIG. 2, the output amplitude modulated and pulse-width modulated product signal $v_Z$ is supplied to an analog-to-digital converter circuit means comprised by a low pass filter formed by resistor $R_o$, operational amplifier $A_1$ and feedback capacitor $C_o$ and an analog-to-digital converter HCO which provides at its output a pulsed waveform signal $V_A$, each pulse of which represents a unit quantity of energy. This pulsed waveform output signal is supplied to the input of a kilowatt hour indicator 12 which may be either a digital or analog KWH indicator for providing a visually observable indication of the kilowatt hours of energy being supplied from a source of alternating current electric energy being monitored.

Automatic error correction on a system-wide basis for the electronic measuring circuit shown in FIG. 2 is provided by a feedback path shown at 13 from the output of the analog-to-digital converter HCO to a second CMOS switching circuit SW2 of the double-pole, double-throw variety having two movable contacts and two sets of fixed contacts as shown. With this arrangement, the signal $v_Z$ from the output of the multiplier circuit SWI is integrated up by the integrator low pass filter $R_o$, $C_o$, A1 until its output potential $V_C$ reaches a reference level $+V_R$. At this point, the hysteresis comparator HCO which comprises the analog-to-digital converter switches the output signal $V_A$ to the opposite polarity so that the feedback through the AEC feedback connector 13 in turn switches CMOS switches SW2 to their opposite state. This in turn causes the output voltage $v_Z$ to change its polarity. As a result, the integrator low pass filter $R_o$, $C_o$, A1 then starts to integrate down toward $-V_R$ and upon reaching the $-V_R$ level again switches the output from the analog-to-digital converter HCO back to its original state thereby completing a cycle of operation of HCO. Since during the up-integration time, any DC-offset error voltage supplied to the integrator is added, and during the down integration time, any DC-offset error voltages are subtracted, the total offset error is averaged out on a system-wide basis during the continuing series of up and down integration times. Thus, any DC-offset error voltages present in the system will be corrected out automatically on a system-wide basis. A similar averaging out of the $v_X$, $v_Y$ terms of the desired terms $v_Z$ does not occur since during the up-integration period switch SW2 supplies a $+v_X$ signal to the integrator analog-to-digital converter and during the down-integration period a negative value $-v_X$ signal is supplied resulting in an addition of both terms over a full cycle as explained more fully in the paper entitled "A Polyphase Microelectronic Watthour Meter"—Miran Milkovic—published in the International Journal of Electronics, 1980, Vol 48, No. 3, Pgs 257–269, the disclosure of which hereby is incorporated into this application in its entirety. An analog indication of the instantaneous watts being delivered is obtained from an analog watts indicator 11 via an integrating filter circuit R, C, and electronic CMOS switches SW4 and SW3. Switch SW3 is switched at the sampling frequency $f_s$ in synchronism with switch SW1 and SW4 is switched at the AEC switching rate fed back over conductor 13. In this circuit switch SW3 acts as an electronic multiplier similar to SW1 to derive the output product signal $\pm v_Z$.

Figure 3:
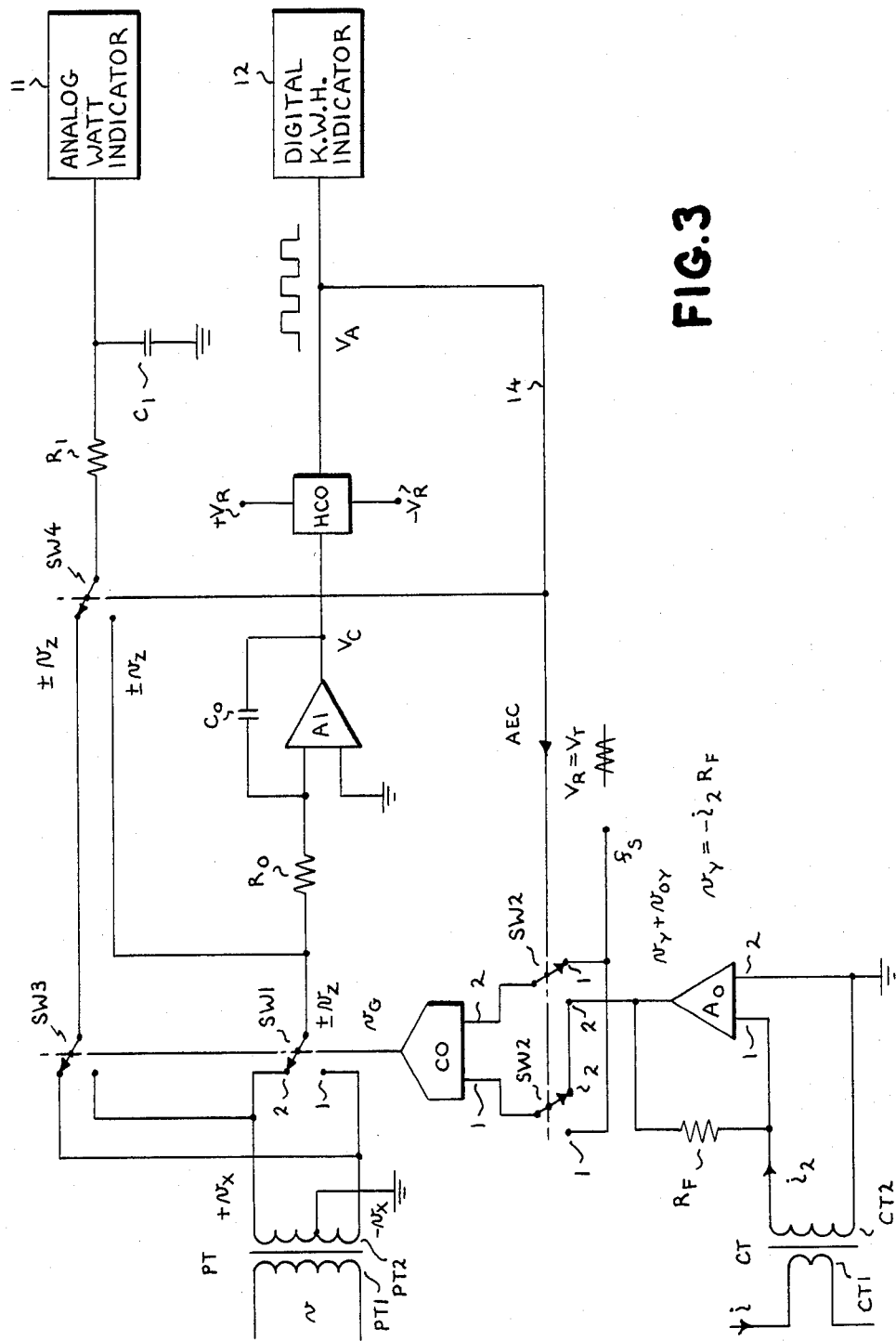
FIG. 3 is a schematic circuit diagram of still a different embodiment of the invention whereby an indication can be derived of the kilowatt hours and watts of electrical energy being supplied from a source of alternating current and system-wide overall automatic offset error correction is provided in a different manner from that shown in FIG. 2.

FIG. 3 of the drawings illustrates a modified form of electronic watthour meter circuit having automatic error correction on a system-wide basis and constructed in accordance with the invention. In this embodiment of the invention, the pulse rate signal $V_A$ appearing at the output of the analog-to-digital converter HCO is fed back over a feedback connector 14 for controlling the switching action of still a different set of CMOS switching circuits SW2 having their movable contacts connected to and controlled by the feedback signal $V_A$ supplied over feedback conductor 14. The CMOS switching circuit SW2 comprises a double-pole, double-throw switch having its fixed contacts 1 connected to the output from the triangular-waveshape generator supplying the reference sampling signal $V_R = V_T$ at a sampling frequency $f_s$; and having its fixed contacts 2 connected to the output of the active load terminated current sensor transformer arrangement CT, $A_o$. With this arrangement, output error correction on a system-wide basis is obtained by shifting the phase of the analog signal $v_Y$, which is proportional to the current and supplied to comparator circuit means CO, with respect to the phase of the triangular waveshape reference signal $V_R$ by reversing the interconnections of these respective signals to the input terminals of the comparator. This is done each time an output unit energy pulse is produced at the output of the analog-to-digital converter HCO. As a result, as the integrator $R_o$, $C_o$, A1 alternately integrates up and down between $+V_R$ and $-V_R$, any DC-offset error voltages present in the system will be averaged out over each cycle of operation of the integrator/analog-to-digital converter while the desired product signal $\pm v_Z$ will be totalized over the same period. For a more detailed description of the construction and operation of this form of electronic measuring circuit providing automatic error control on a system-wide basis, reference is made to the above-noted U.S. Pat. No. 4,066,960, the disclosure of which is hereby incorporated into this application in its entirety. The instantaneous watts being delivered are derived through the circuit branch SW3, SW4, R. C, and indicator 11 as described above with relation to FIG. 2.

Figure 4:
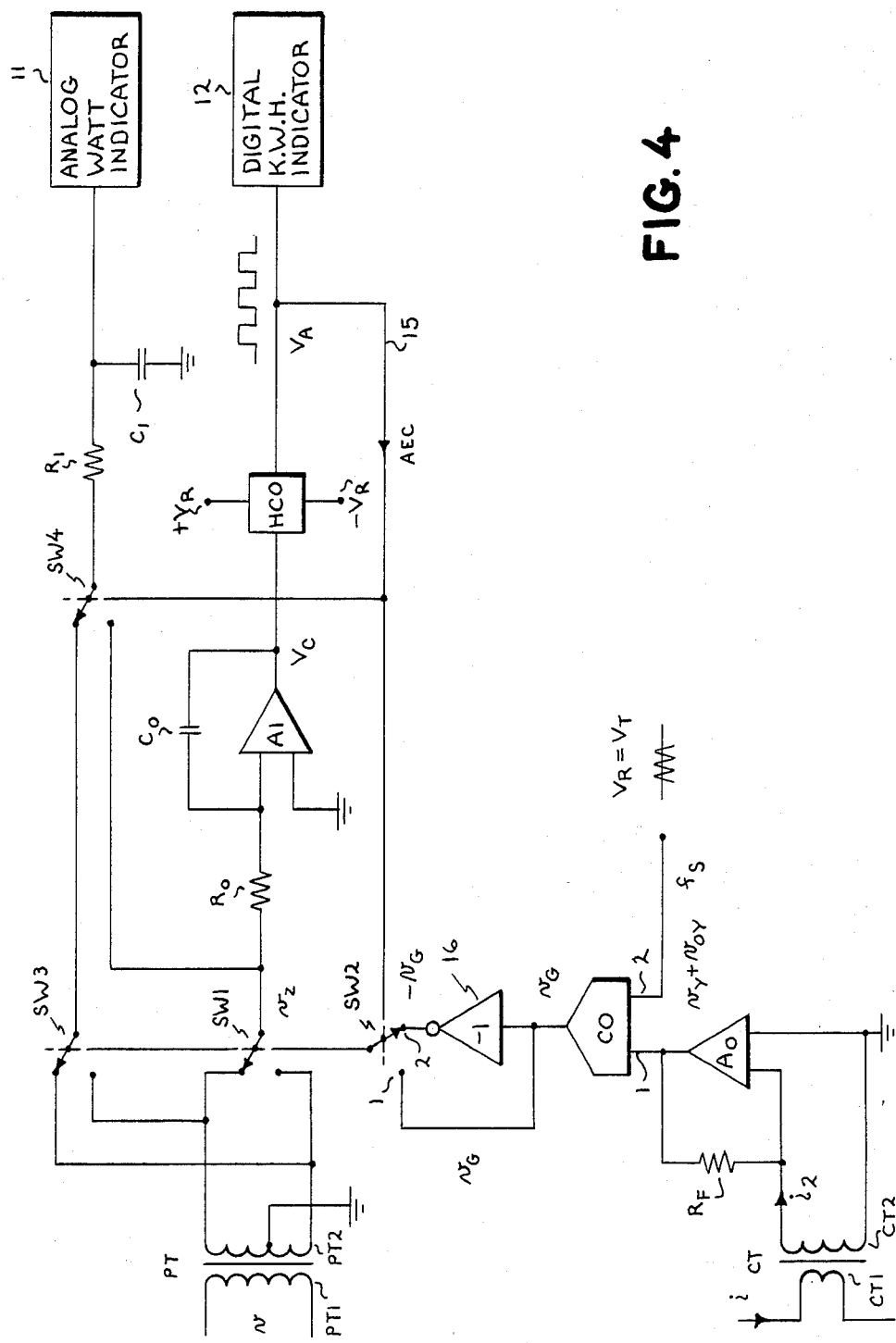
FIG. 4 is a schematic circuit diagram of still a different form of the electronic measuring circuit provided by the invention wherein a measure of the kilowatt hours and watts of electrical energy supplied from an alternating current source can be derived and which also include an overall automatic offset error correction of the circuit on a system-wide basis.

FIG. 4 is a schematic circuit diagram of still a different form of electronic measuring circuit according to the invention which provides system-wide automatic error correction by feeding back the pulsed output signal $V_A$ appearing at the output of the analog-to-digital converter HCO through a feedback conductor 15 to control the switching action of a single-pole, double-throw CMOS electronic switching circuit SW2 connected between the output of comparator CO and the controllable switching contact of the CMOS electronic multiplier switch SW1. Switch SW2 has one of its fixed contacts 1 connected directly to the output of comparator CO while the remaining fixed contact 2 is connected to the output of comparator CO through an inverter 16. Because of the inverter 16, the signal $-v_G$ is at the fixed contact 2. Consequently, the automatic error correction feedback signal supplied over conductor 15 causes switch SW2 to alternately change the polarity of the input signal $v_G$ from $-v_G$ to $+v_G$ midway between each integration cycle of the output analog-to-digital converter HCO output signal. This results in averaging out any DC-offset error potential present in the system over a full cycle of operation of the analog-to-digital converter means while causing the desired $v_X$ and $v_G$ signals to be added cumulatively during both the up and down integration portion of integrating filter circuit $R_o$, $C_o$, A1 and analog-to-digital converter HCO. For a more detailed description of the construction and operation of this form of measuring circuit providing automatic error correction on a system-wide basis, reference is made to U.S. Pat. No. 4,092,592—issued May 30, 1978 for an "Electronic KWH Meter Having Virtual Ground Insulation"—Miran Milkovic, inventor, and assigned to the General Electric Company. The disclosure of U.S. Pat. No. 4,092,592 is hereby incorporated into the disclosure of this application in its entirety. Again an instantaneous watts signal is derived through a branch circuit SW3, SW4, $R_1$, $C_1$ similar to that described above with relation to FIG. 2.

Figure 5:
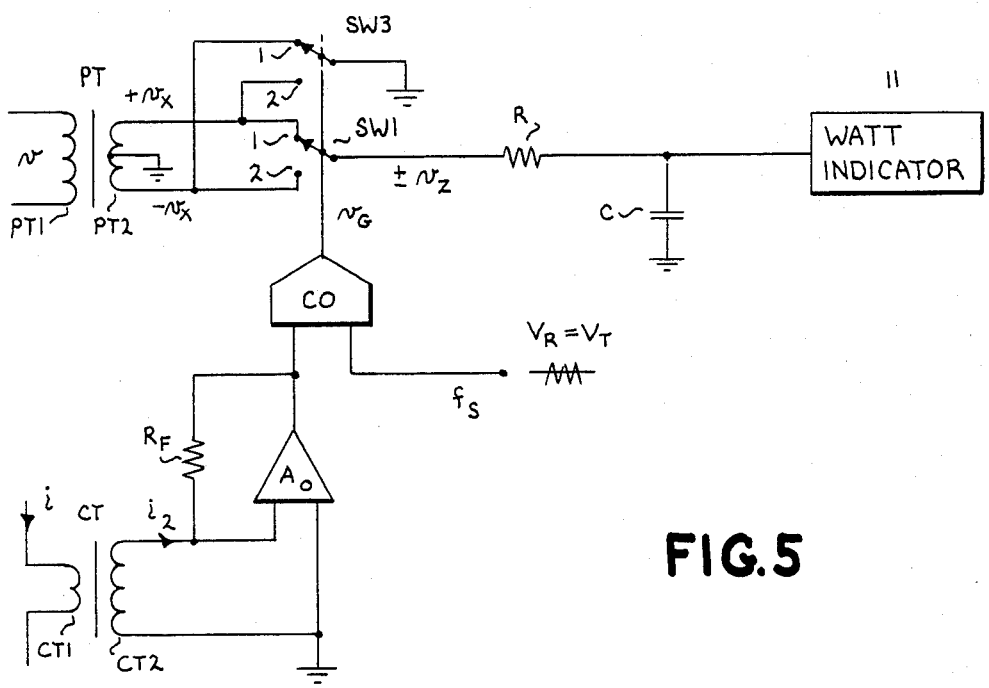
FIG. 5 is a schematic circuit diagram of an electronic measuring circuit according to the invention employing an active load terminated current sensor and an input voltage transformer having a single secondary winding for deriving an output indication of the instantaneous watts being supplied from a source of alternating current electric energy.

FIG. 5 of the drawings is a schematic illustration of a minimum peripheral cost circuit constructed according to the invention which allows the use of both voltage transformers PT and current sensing transformers CT which require only a single secondary winding with neither requiring a center tap. In the FIG. 5 circuit, an active load terminated current sensor transformer CT, $A_o$ is employed for deriving the current proportional signal $v_Y + V_{oY}$ that is supplied to a comparator CO along with the sampling reference signal $V_R = V_T$ having a sampling frequency $f_s$ that is much greater than the frequency of the alternating current being measured.

The pulse width modulated output signal $v_G$ appearing at the output of comparator CO which is proportional to the current to be measured i flowing in the primary winding CT1 of the active load terminated current sensing transformer CT, $A_o1$, is applied as a switch controlling input to the movable contact of a set of double-pole, double-throw CMOS switching multiplying circuits SWI. The movable contact of one of the CMOS swtiches SW1 is connected directly to ground, and the movable contact of the other CMOS switch is used to derive the output product signal $\pm v_Z = KVI \cos \Theta$ as is described earlier with relation to FIG. 1 of the drawings. The fixed contacts 1 and 2 of the respective double-pole, double-throw CMOS switch elements SWI are connected in reverse polarity across the secondary winding PT2 of an input voltage transformer PT having its primary winding PT1 supplied with the voltage v of an alternating current electric energy source to be measured. Switching of the CMOS electronic switching circuit SW1 at the sampling frequency $f_s$ by the product $v_G$ from comparator CO will derive the output amplitude modulated and pulse-width modulated product signal $\pm v_Z$ which is representative of the instantaneous power being supplied from a source of alternating current electric energy being monitored. For a more detailed description of the manner in which this output signal is derived and for the theory and illustration of the wave form of the resultant signal, reference is made to U.S. Pat. No. 3,955,138 listed above and to U.S. Pat. No. 4,015,140, issued Mar. 29, 1977 for a "Multiplier For Producing Phase Shift Error-Free Signal Representing Product Out-Of-Phase Input'-'—Miran Milkovic, inventor and assigned to the General Electric Company, the disclosures of which are hereby incorporated into the disclosure of this application in their entirety.

From a comparison of the measuring circuit shown in FIG. 5 to the measuring circuit shown and described with relation to FIG. 1 of the drawings, it will be appreciated that the primary distinction lies in the difference in construction required for the voltage transformer PT used with the respective circuits and in the design of the CMOS switching multiplier circuit. The requirement for a center-tapped instrument voltage transformer used in the FIG. 1 circuit adds considerably to the cost of that circuit in contrast to the FIG. 5 circuit wherein only a single secondary winding PT2 is required. This savings in cost of the voltage transformer is accomplished with increased complexity of the design of the CMOS switching multiplier circuit SW1. However, since the multiplier circuit SW1 can be fabricated substantially entirely in solid state, semiconductor, monolithic integrated circuit form at relatively little or no additional cost from the multiplier switching circuit shown in FIG. 1, the FIG. 5 circuit is to be preferred from a cost standpoint. The circuit thus devised represents the lowest cost solid state, semiconductor electronic watt meter because of the use of a low cost current sensor and voltage sensor each requiring only a single secondary winding.

From the foregoing description, it will be appreciated that the present invention provides a number of new and improved electronic measuring watt and KWH electronic meter circuits which are less expensive than known circuits of the same general type that require conventional current transformer sensors, by employing in their stead an active load terminated current transformer with active load termination for use as the current sensor. As a result, circuits which are simpler, smaller in size and weight and lower in cost can be designed and fabricated for the most part in solid state, semiconductor, monolithic integrated circuit form. In preferred forms of the invention, the electronic measuring circuit further includes automatic offset error control circuit means intercoupled between the output from the measuring circuit and the input to a multiplier circuit comprising a part of the measuring circuit for automatically averaging out any DC-offset error voltages produced in the measuring circuit on a system-wide basis. Several different forms of such a circuit providing automatic offset error control have been described.

INDUSTRIAL APPLICABILITY

The electronics measuring circuits described and claimed in this application are intended to provide relatively low cost measuring circuits for obtaining a measure of the instantaneous watts and/or kilowatt hours of alternating current electric energy supplied from a source to a consumer because the circuits can be fabricated in solid state, semiconductor integrated circuit form, and otherwise are designed to employ low cost sensor components, whereby the provision of such measuring circuits at relatively low cost is made possible.

Having described several embodiments of a new and improved electronic measuring circuit constructed according to the invention, it is believed obvious that other modifications, variations and changes in the invention will be suggested to those skilled in the art in the light of the above teachings. It is therefore to be understood that changes may be made in the particular embodiments of the invention which are within the full intended scope of the invention as defined by the appended claims.

What is claimed is:

1. An electronic measuring circuit for measuring alternating current electrical energy, said measuring circuit having an active load terminated input current transformer with active load termination for deriving an input signal representative of the current supplied from a source of alternating current electric energy to be monitored and a voltage transformer for deriving an input signal representative of the voltage supplied from the source, electronic multiplier circuit means for multiplying together the signal representative of the current and the signal representative of the voltage, said electric multiplier circuit means comprising CMOS type electronic switches having first and second inputs and an output, comparator circuit means supplied with an input reference signal and with either of the signals representative of the current or voltage as a second input and for deriving at the output thereof a pulse width modulated signal representative of either the current or voltage that is supplied to the first input to said multiplier circuit means, the other of said current or voltage signals being supplied to the second input terminal of the multiplier circuit means, and means for deriving at the output from said multiplier circuit means an output amplitude modulated and pulse width modulated product signal that is representative of the product of the current and voltage supplied from the source of electric energy with any DC offset error caused by the active load terminated input current transformer being automatically zeroed out.

2. An electronic measuring circuit according to claim 1 wherein the reference signal supplied to one of the inputs to the comparator circuit means is triangular wave-shaped and has a sampling frequency $f_s$ which is very much higher than the frequency of the alternating current electric energy being measured.

3. An electronic measuring circuit according to claim 2 further including automatic offset error control circuit means intercoupled between the output from the measuring circuit and an input of the multiplier circuit means for automatically averaging out any DC offset error voltages produced in the measuring circuit on a system-wide basis.

4. An electronic measuring circuit according to claim 3 wherein said automatic offset error control circuit means comprises analog-to-digital converter means coupled to the output from said multiplier circuit means for deriving an output pulse-waveform signal each pulse of which represents a fixed unit amount of electric energy and means for feeding back said pulsed waveform signal to an input of said multiplier circuit means for reversing polarity of one of the inputs to said multiplier circuit means with each unit output pulse produced by the analog-to-digital converter means to thereby average out any DC offset error potentials in the measuring circuit on a system-wide basis.

5. An electronic measuring circuit according to claim 4 wherein said multiplier circuit means includes a polarity reversing switch in the second input thereto and the output from said analog-to-digital converter means is fed back to control the polarity switching action of the polarity reversing switch with the unit energy output pulses of the analog-to-digital converter means.

6. An electronic measuring circuit according to claim 4 wherein the two inputs to said comparator circuit means each include signal interchange switch means for alternately interchanging the input terminals of the comparator circuit means to which the input reference signal and the input signal representative of the current or the voltage are applied to thereby average out any DC offset error potentials in the measuring circuit on a system-wide basis, said signal interchange switch means being controlled by the output pulsed waveform signal fed back from said analog-to-digital converter means.

7. An electronic measuring circuit according to claim 4 wherein the comparator circuit means includes inverter means and polarity reversing switch means interconnected in circuit relationship between the output of the comparator circuit means and the multiplier circuit means for coupling the output from the comparator circuit means to the first input to the multiplier circuit means both directly and through the inverter means, the output from said analog-to-digital converter means being fed back to control operation of said polarity reversing switch means for alternately coupling the output from said comparator circuit means to the first input of the multiplier circuit means both directly and through the inverter means to thereby alternately change the polarity of the comparator output signal supplied to the multiplier circuit means and average out DC offset error voltages produced in the measuring circuit on a system-wide basis.

8. An electronic measuring circuit according to claim 4 wherein the voltage transformer has only a single secondary winding and the electronic multiplier circuit means comprises two double-pole, double-throw CMOS type electronic switches with their movable switching contacts being coupled to and operated by the output from the comparator circuit means, the fixed contacts of both CMOS electronic switches being connected to the respective end terminals of the single secondary winding of the voltage transformer, the movable switching contact of one of the CMOS switches being connected directly to ground and the movable contact of the other CMOS switch supplying the output amplitude and pulse-width modulated product signal from the electronic multiplier circuit means.

9. An electronic measuring circuit according to claim 8 further including integrating filter circuit means coupled to the output from said multiplier circuit means for deriving an output analog signal representative of the instantaneous watts being supplied by the source of electric energy being monitored.

10. An electronic measuring circuit according to claim 1 4, 5, 6, 7 or 8 wherein the electronic multiplier circuit means and comparator circuit means and interconnections therebetween all are fabricated in solid state semiconductor monolithic integrated circuit form, and further including integrating filter circuit means coupled to the output from the multiplier circuit means and fabricated therewith in monolithic integrated circuit form, and watt indicating means coupled to the output from the integrating filter circuit means for deriving an output indication of the instantaneous watts being supplied by a source of electrical energy being monitored.

11. An electronic measuring circuit according to either of claims 4, 5, 6, 7 or 8 wherein the electronic multiplier circuit means, the comparator circuit means, the analog-to-digital converter means, and the interconnections therebetween all are fabricated in solid state semiconductor monolithic integrated circuit form and further including kilowatt hour indicating means coupled to the output from the analog-to-digital converter means for deriving an output indication of the kilowatt hours of electrical energy being supplied by the source of electrical energy being monitored.

12. An electronic measuring circuit according to either of claims 4, 5, 6, 7 or 8 wherein the electronic multiplier circuit means, the comparator circuit means, the analog-to-digital converter means, the additional CMOS switching means and the interconnections therebetween all are fabricated in solid state semiconductor, monolithic integrated circuit form and further including kilowatt hour indicating means coupled to the output from the analog-to-digital converter means for deriving an output indication of the kilowatt hours of electrical energy being supplied by a source of electrical energy being monitored, integrating filter circuit means coupled to the output from the multiplier circuit means and fabricated therewith in solid state semiconductor integrated circuit form, and watt indicating means coupled to the output from the integrating filter circuit means for deriving an output indication of the instantaneous watts being supplied by a source of electrical energy being monitored.

13. An electronic measuring circuit according to claim 1 wherein said active load terminated input current transformer comprises inductively coupled primary and secondary windings having the current to be measured supplied to the primary winding from a source of electrical energy being monitored and a transresistance operational amplifier terminating said secondary winding in a virtual short circuit and supplying an output voltage proportional to the current flowing in the primary winding.

14. An electronic measuring circuit according to claim 13 wherein the reference signal supplied to one of the inputs to the comparator circuit means is triangular wave-shaped and has a sampling frequency $f_s$ which is very much higher than the frequency of the alternating current electric energy being measured.

15. An electronic measuring circuit according to claim 14 further including automatic offset error control circuit means intercoupled between the output from the measuring circuit and an input of the multiplier circuit means for automatically averaging out any DC offset error voltages produced in the measuring circuit on a system-wide basis.

16. An electronic measuring circuit according to claim 15 wherein said automatic offset error control circuit means comprises analog-to-digital converter means coupled to the output from said multiplier circuit means for deriving an output pulse-waveform signal each pulse of which represents a fixed unit amount of electric energy and means for feeding back said pulsed waveform signal to an input of said multiplier circuit means for reversing polarity of one of the inputs to said multiplier circuit means with each unit output pulse produced by the analog-to-digital converter means to thereby average out an DC offset error potentials in the measuring circuit on a system-wide basis.

17. An electronic measuring circuit according to claim 16 wherein said multiplier circuit means includes a polarity reversing switch in the second input thereto and the output from said analog-to-digital converter means is fed back to control the polarity switching action of the polarity reversing switch with the unit energy output pulses of the analog-to-digital converter means.

18. An electronic measuring circuit according to claim 16 wherein the two inputs to said comparator circuit means each include signal interchange switch means for alternately interchanging the input terminals of the comparator circuit means to which the input reference signal and the input signal representative of the current or the voltage are applied to thereby average out any DC offset error potentials in the measuring circuit on a system-wide basis, said interchange switch means being controlled by the analog-to-digital converter means.

19. An electronic measuring circuit according to claim 16 wherein the comparator circuit means includes inverter means and polarity reversing switch means interconnected in circuit relationship between the output of the comparator circuit means and the multiplier circuit means for coupling the output from the comparator circuit means to the first input to the multiplier circuit means both directly and through the inverter means, the output from said analog-to-digital converter means being fed back to control operation of said polarity reversing switch means for alternately coupling the output from said comparator circuit means to the first input of the multiplier circuit means both directly and through the inverter means to thereby alternately change the polarity of the comparator output signal supplied to the multiplier circuit means and average out DC offset error voltages produced in the measuring circuit on a system-wide basis.

20. An electronic measuring circuit according to claim 16 wherein the voltage transformer has only a single secondary winding and the electronic multiplier circuit means comprises two double-pole, double-throw CMOS type electronic switches with their movable switching contacts being coupled to and operated by the output from the comparator circuit means, the fixed contacts of both CMOS electronic switches being connected to the respective end terminals of the single secondary winding of the voltage transformer, the movable switching contact of one of the CMOS switches being connected directly to ground and the movable contact of the other CMOS switch supplying the output amplitude and pulse-width modulated product signal from the electronic multiplier circuit means.

21. An electronic measuring circuit according to claim 20 further including integrating filter circuit means coupled to the output from the movable contact of said other CMOS switch for deriving an output analog signal representative of the instantaneous watts being supplied by the source of electric energy being monitored.

22. An electronic measuring circuit according to claim 13, 16, 17, 18 or 19 wherein the electronic multiplier circuit means and comparator circuit means and interconnections therebetween all are fabricated in solid state semiconductor monolithic integrated circuit form, and further including integrating filter circuit means coupled to the output from the multiplier circuit means and fabricated therewith in monolithic integrated circuit form, and watt indicating means coupled to the output from the integrating filter circuit means for deriving an output indication of the instantaneous watte being supplied by a source of electrical energy being monitored.

23. An electronic measuring circuit according to either of claims 13, 16, 17, 18 or 19 wherein the electronic multiplier circuit means, the comparator circuit means, the analog-to-digital converter means, and the interconnections therebetween all are fabricated in solid state semiconductor monolithic integrated circuit form and further including kilowatt hour indicating means coupled to the output from the analog-to-digital converter means for deriving an output indication of the kilowatt hours of electrical energy being supplied by the source of electrical energy being monitored.

24. An electronic measuring circuit according to either of claims 13, 16, 17, 18 or 19 wherein the electronic multiplier circuit means, the comparator circuit means, the analog-to-digital converter means and the interconnections therebetween all are fabricated in solid state semiconductor, monolithic integrated circuit form and further including kilowatt hour indicating means coupled to the output from the analog-to-digital converter means for deriving an output indication of the kilowatt hours of electrical energy being monitored, and integrating filter circuit means coupled to the output from the multiplier circuit means and fabricated therewith in solid state monolithic integrated circuit form, and watt indicating means coupled to the output from the integrating filter circuit means for deriving an output indication of the instantaneous watts being supplied by a source of electrical energy being monitored.

* * * * *